(12) United States Patent
Fujii et al.

(10) Patent No.: US 7,376,161 B2
(45) Date of Patent: May 20, 2008

(54) MODULATION LIGHT SOURCE, IMAGE DISPLAY APPARATUS INCLUDING THE SAME, AND METHOD OF DRIVING MODULATION LIGHT SOURCE

(75) Inventors: Kazunari Fujii, Kanagawa-ken (JP); Yukio Furukawa, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 85 days.

(21) Appl. No.: 10/579,828

(22) PCT Filed: Mar. 18, 2005

(86) PCT No.: PCT/JP2005/005618

§ 371 (c)(1),
(2), (4) Date: May 17, 2006

(87) PCT Pub. No.: WO2005/091450

PCT Pub. Date: Sep. 29, 2005

(65) Prior Publication Data

US 2007/0071055 A1    Mar. 29, 2007

(30) Foreign Application Priority Data

Mar. 23, 2004    (JP) .............................. 2004-084439

(51) Int. Cl.
*H01S 3/10* (2006.01)
*H01S 3/08* (2006.01)

(52) U.S. Cl. ............................. 372/21; 372/22; 372/26; 372/96

(58) Field of Classification Search .................. 372/21, 372/22, 25, 26, 29.016, 29.023, 30, 50.1, 372/50.11, 96
See application file for complete search history.

(56) References Cited

U.S. PATENT DOCUMENTS

| 6,738,398 | B2 * | 5/2004 | Hirata et al. ................... 372/32 |
| 7,039,077 | B2 | 5/2006 | Furukawa et al. ............ 372/21 |
| 2007/0052797 | A1 | 3/2007 | Fujii et al. .................. 348/102 |
| 2007/0115072 | A1 | 5/2007 | Kato et al. ................... 331/176 |
| 2007/0115526 | A1 | 5/2007 | Kato et al. ................... 359/198 |

FOREIGN PATENT DOCUMENTS

| JP | 1-183180 | 7/1989 |
| JP | 2002-43683 | 2/2002 |
| JP | 2002-43698 | 2/2002 |
| JP | 2004-70338 | 3/2004 |

OTHER PUBLICATIONS

Y. Kitaoka, et al., "Wavelength Stabilization of a Distributed Bragg Reflector Laser Diode by Use of Complementary Current Injection", Optics Letters, vol. 28, No. 11, Jun. 1, 2003, pp. 914-916.

* cited by examiner

*Primary Examiner*—Armando Rodriguez
(74) *Attorney, Agent, or Firm*—Fitzpatrick, Cella, Harper & Scinto

(57) ABSTRACT

A modulation light source capable of maintaining thermal stability of a gain part is provided. A modulation light source includes a DBR laser having a DBR part, a phase part and a gain part, a light wavelength conversion device that receives a fundamental wave from the DBR laser and from which an SHG light is emitted, and a control means for controlling the DBR laser. A substantially constant current is supplied to the gain part for a modulation time period of a PWM signal. At least one of the DBR part and the phase part is controlled for modulation using a current based on the PWM signal.

11 Claims, 5 Drawing Sheets

MODULATION LIGHT SOURCE, IMAGE DISPLAY APPARATUS INCLUDING THE SAME, AND METHOD OF DRIVING MODULATION LIGHT SOURCE

TECHNICAL FIELD

The present invention relates to a modulation light source using a DBR (distributed Bragg reflector) laser, an image display apparatus including the same, and a light modulation method.

BACKGROUND ART

An SHG (second harmonic generation) laser light source has been proposed (see Japanese Patent Application Laid-Open No. 2002-043683). FIG. 8 shows its structure. As shown in this drawing, provided are a DBR laser 1010 which includes a DBR part 1013, a phase part 1012, and a gain part 1011, a SHG device 1020, and a control part 1030. The control part 1030 changes a current flowing through the DBR part 1013 and the phase part 1012 at a predetermined change current ratio to modulate an intensity of SHG light. The control part 1030 modulates the intensity of SHG light based on a result obtained by detection of a photo detector that receives second harmonic light from the SHG device 1020.

A method of modulating a current flowing through the gain part 1011 based on a PWM (pulse width modulation) signal and controlling an oscillation time of the laser to thereby express gradation levels has been generally used for a laser beam printer and the like.

In Japanese Patent Application Laid-Open No. 2002-043683, a method of changing a current flowing through the DBR part 1013 and the phase part 1012 at the predetermined change current ratio to modulate an intensity of SHG light is used and effective to express binary values of ON-OFF in a recording application such as an optical disk. However, the inventors of the present invention found a problem in that such a technique requires a high-precision analog circuit in order to realize high-resolution gradation level expression and the linearity of gradation expression is impaired in the case where a peak point of conversion efficiency of the SHG light is deviated due to a change in environmental temperature, or the like.

In Japanese Patent Application Laid-Open No. 2002-043683, shown is an example in which a desirable intensity of the SHG light is obtained by injecting a current based on an arbitrary pattern of the PWM signal to the gain part 1011. In this case, there is a problem in that a temperature of the DBR laser 1010 and a temperature of the light wavelength conversion device 1020 depend on the pattern of the PWM signal. As a result, an oscillation wavelength of the DBR laser 1010 and a phase matching wavelength of the light wavelength conversion device 1020 depend on the pattern of the PWM signal. Therefore, the intensity of the SHG light does not become constant.

DISCLOSURE OF THE INVENTION

An object of the present invention is to solve such problems, and more specifically to provide a modulation light source capable of maintaining thermal stabilities of a DBR laser and a light wavelength conversion device, that is, easily realizing high-resolution gradation level expression of SHG light without depending on a pattern of a PWM signal.

Therefore the present invention provides a modulation light source including a DBR laser having a DBR part, a phase part and a gain part; a light wavelength conversion device; and control means, in which the control means is a means for controlling at least one of the DBR part and the phase part for modulation using a current based on a PWM signal and the gain part is a part to which a substantially constant current is supplied.

Further, the present invention provides a method of driving a modulation light source including a DBR laser having a DBR part, a phase part and a gain part, a light wavelength conversion device, and control means, including: controlling at least one of the DBR part and the phase part for modulation using a current based on a PWM signal by the control means; and supplying a substantially constant current to the gain part.

According to the present invention, it is possible to provide a modulation light source capable of easily realizing the high-resolution gradation level expression of the SHG light. In addition, according to the present invention, it is possible to provide a modulation light source that maintains the thermal stabilities of the DBR laser and the light wavelength conversion device, that is, that does not depend on the pattern of the PWM signal.

BEST MODE FOR CARRYING OUT THE INVENTION

A modulation light source according to the present invention is a modulation light source which includes a DBR laser having a DBR part, a phase part, and a gain part, a light wavelength conversion device, and a control means and which is characterized in that the control means is a means for controlling at least one of the DBR part and the phase part for modulation using a current based on a PWM signal and the gain part is a part to which a substantially constant current is supplied. As a result, thermal stabilities of the DBR laser and the light wavelength conversion device is maintained, that is, high-resolution gradation level expression of SHG light is realized without depending on a pattern of the PWM signal.

Hereinafter, a more detailed description will be provided.

Figure 1:
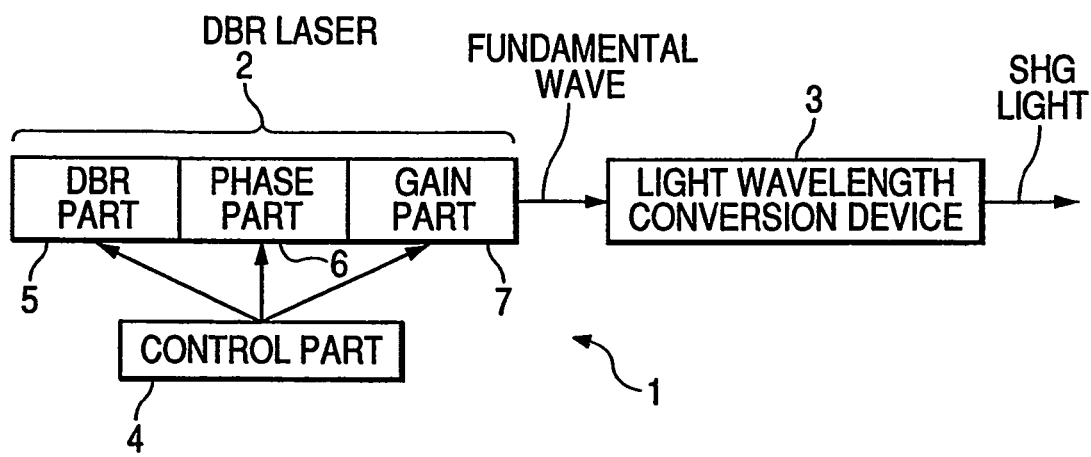
FIG. 1 is a schematic structural diagram showing a modulation light source according to a first embodiment of the present invention.

FIG. 1 is a schematic diagram showing a structure of the modulation light source according to the present invention. Reference numeral 1 denotes the modulation light source, 2 denotes the DBR laser, 3 denotes the light wavelength conversion device, 4 denotes a control part, 5 denotes the DBR part, 6 denotes the phase part, and 7 denotes the gain part.

The DBR laser 2 is composed of the DBR part 5, the phase part 6, and the gain part 7. A fundamental wave emitted from the gain part 7 is incident on the light wavelength conversion device 3. A modulation wave is exited from the light wavelength conversion device 3. More specifically, the fundamental wave is an infrared wave and the modulation wave is an SHG light.

Figure 2:
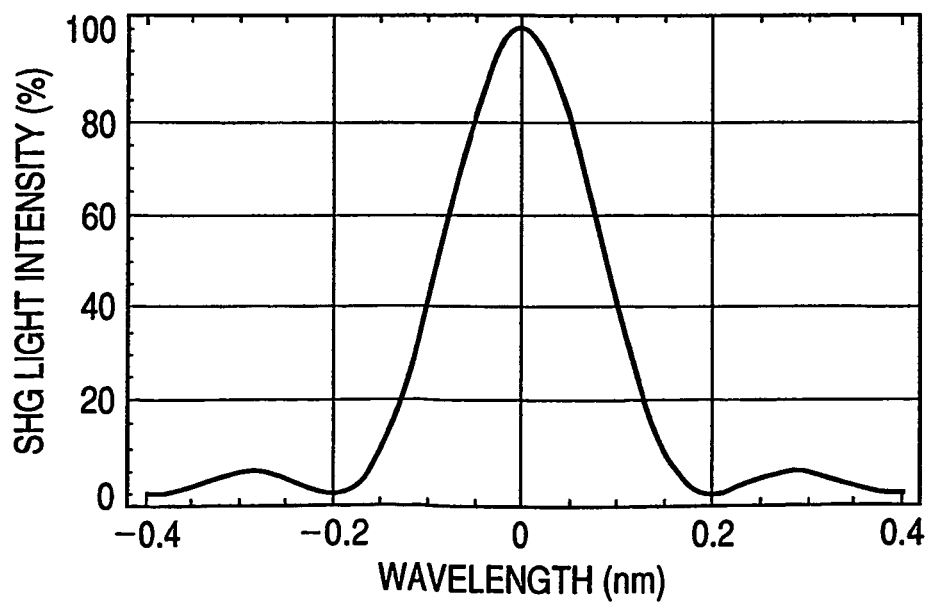
FIG. 2 is an explanatory graph showing a characteristic of a light wavelength conversion device.

FIG. 2 shows an example of an intensity of the SHG light near a phase matching wavelength of the light wavelength conversion device 3 (abscissa indicates a deviation from the phase matching wavelength in wavelength of the fundamental wave). As shown in FIG. 2, when the wavelength of the fundamental wave is deviated from the phase matching wavelength by 0.08 nm, the intensity of the SHG light becomes substantially 50% of a peak value. When the wavelength of the fundamental wave is deviated from the phase matching wavelength by 0.4 nm or more, the intensity of the SHG light becomes substantially 0%.

The control part 4 generates a PWM signal which is a pulse width modulation signal according to a gradation level of a pixel based on a signal (more specifically, an image signal) from outside, and controls at least one of the DBR part 5 and the phase part 6 for modulation using a current based on the PWM signal. In more detail, the current allowed to enter at least one of the DBR part 5 and the phase part 6 is controlled based on the PWM signal, so an oscillation wavelength of the fundamental wave changes. Therefore, the SHG light is modulated based on the characteristic of the light wavelength conversion device 3 as shown in FIG. 2. In more detail, an OFF current is set such that SHG conversion efficiency becomes substantially 0% at the wavelength of the fundamental wave when the PWM signal is OFF, an ON current is set such that the SHG conversion efficiency becomes substantially a peak at the wavelength of the fundamental wave when the PWM signal is ON, and a light emission time of the SHG light is controlled, thereby expressing gradation levels. In this case, a substantially constant current is supplied to the gain part 7 for a modulation time of the PWM signal.

On the other hand, a method of directly controlling an oscillation time of the DBR laser has also been considered for gradation level expression. However, according to the method, the current based on an arbitrary pattern of the PWM signal is injected to the gain part. Therefore, a temperature of the DBR laser changed to change the oscillation wavelength of the DBR laser, so a stable output of the SHG light cannot be obtained. In addition, an output of the fundamental wave is changed to change a temperature of the light wavelength conversion device on which the fundamental wave is incident. Therefore, the phase matching wavelength changes, so a stable output of the SHG light cannot be obtained. Such a phenomenon significantly occurs in the case where a high-power modulation light source is intended to be realized.

Thus, the substantially constant current is supplied to the gain part 7 and at least one of the DBR part 5 and the phase part 6 is controlled for modulation using the current based on the PWM signal to maintain the thermal stabilities of the DBR laser 2 and the light wavelength conversion device 3. That is, the high-resolution gradation level (for example, 256 gradation levels) expression of the SHG light can be realized without deterioration of the characteristic by depending on the pattern of the PWM signal.

First Embodiment

Hereinafter, a more specific example according to a first embodiment of the present invention will be described with reference to the drawings.

FIG. 1 is a structural diagram showing the modulation light source 1 according to this embodiment. In FIG. 1, the DBR laser 2 is composed of the DBR part 5 in which a diffraction grating is formed, the phase part 6, and the gain part 7, and generates fundamental light having a wavelength of 1,064 nm. The light wavelength conversion device 3 is made of LN crystal having a periodical polarization inversion waveguide structure, and subjects wavelength conversion to the fundamental light emitted from the DBR laser 2 to output an SHG light having a wavelength of 532 nm.

Figure 3:
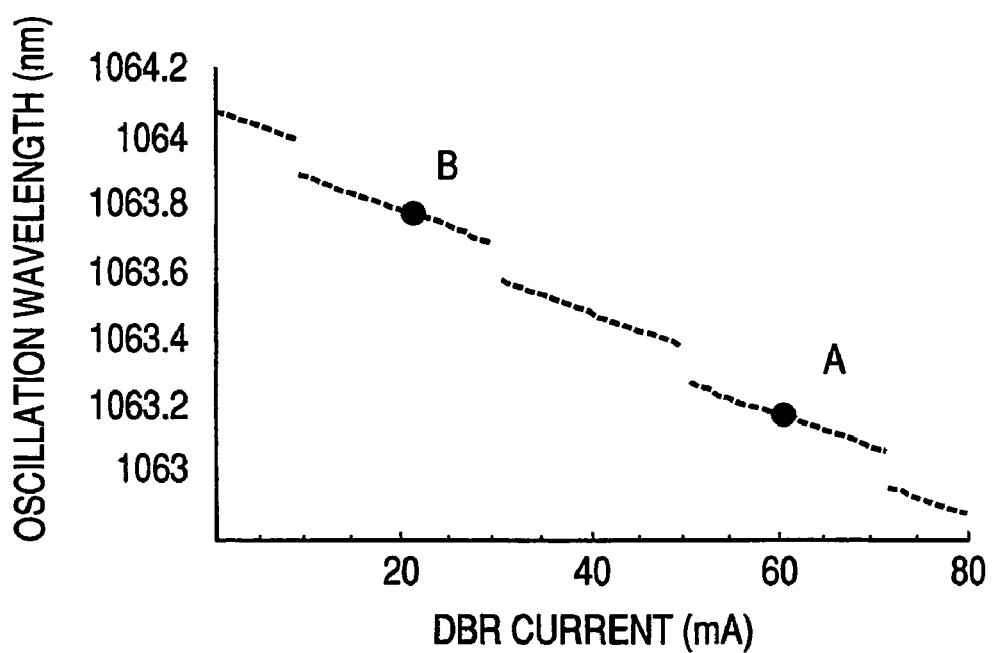
FIG. 3 is an explanatory graph showing a relationship between a current flowing through a DBR part and an oscillation wavelength of a fundamental wave.

In this embodiment, the DBR part 5 is controlled for modulation using the current based on the PWM signal. The substantially constant current is supplied to the phase part 6 and the gain part 7 for a time period sufficiently longer than that corresponding to a maximal pulse width of the PWM signal (for example, a time period of μsec. order). In this case, the oscillation wavelength of the fundamental wave changes with respect to a current flowing through the DBR part 5 as shown in FIG. 3. The phase matching wavelength of the light wavelength conversion device 3 is adjusted in advance so as to become a wavelength at a point A in FIG. 3. A DBR current at the point A in FIG. 3 is set to an ON value of the PWM signal and a DBR current at a point B is set to an OFF value of the PWM signal. Here, when the fundamental wave is converted into the SHG light by the light wavelength conversion device 3, a relationship between a pulse width and an analog intensity of the SHG light becomes that shown in FIG. 4.

Figure 4:
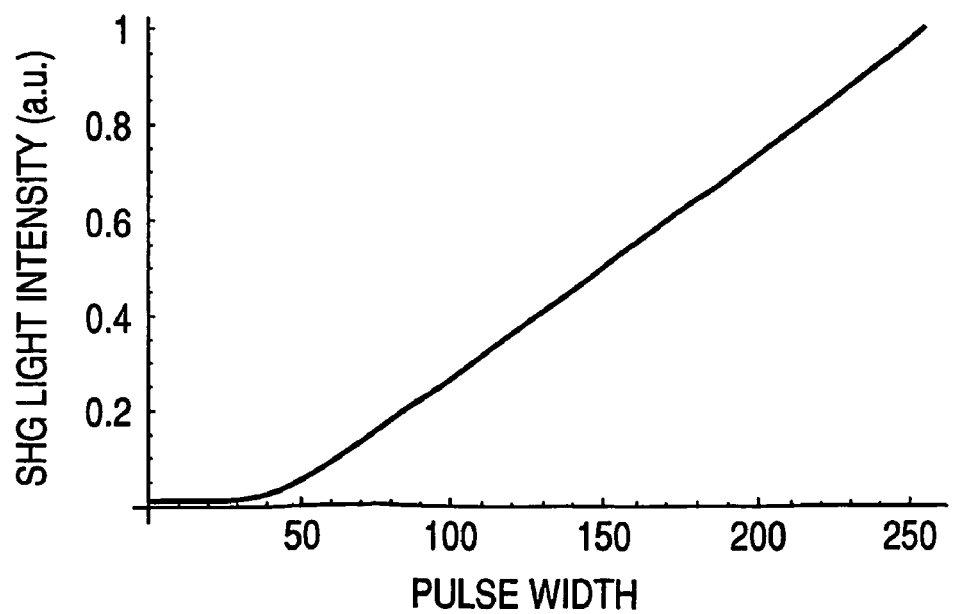
FIG. 4 is an explanatory graph showing gradation level expression.

FIG. 4 is a graph showing a relationship between a pulse width and an SHG light intensity in the case where the abscissa shows a pulse width indicating an ON value when 256 gradation levels are expressed by PWM control. As shown in FIG. 4, when two values at the points A and B are modulated using the PWM signal, it is possible to realize substantially linear gradation level expression. The reason why a change amount in intensity of the SHG light to the pulse width is small in a range in which the pulse width is narrow is that a change in wavelength for the time period does not reach the point A. Therefore, the relationship between the pulse width and the SHG light intensity is successive and substantially linear, so the gradation level expression can be preformed using the PWM signal. Further, even if the point A (ON value) is deviated from the peak of conversion efficiency, the SHG light intensity can be controlled substantially linearly with respect to the pulse width. Therefore, it is possible to express gradation levels without using a special design. In this embodiment, 256 gradation levels can be expressed.

Second Embodiment

In the first embodiment, the example in which the PWM signal is inputted to only the DBR part 5 is described. Even when both the DBR part 5 and the phase part 6 are controlled for modulation using the current based on the PWM signal, the same effect can be obtained.

Figure 5:
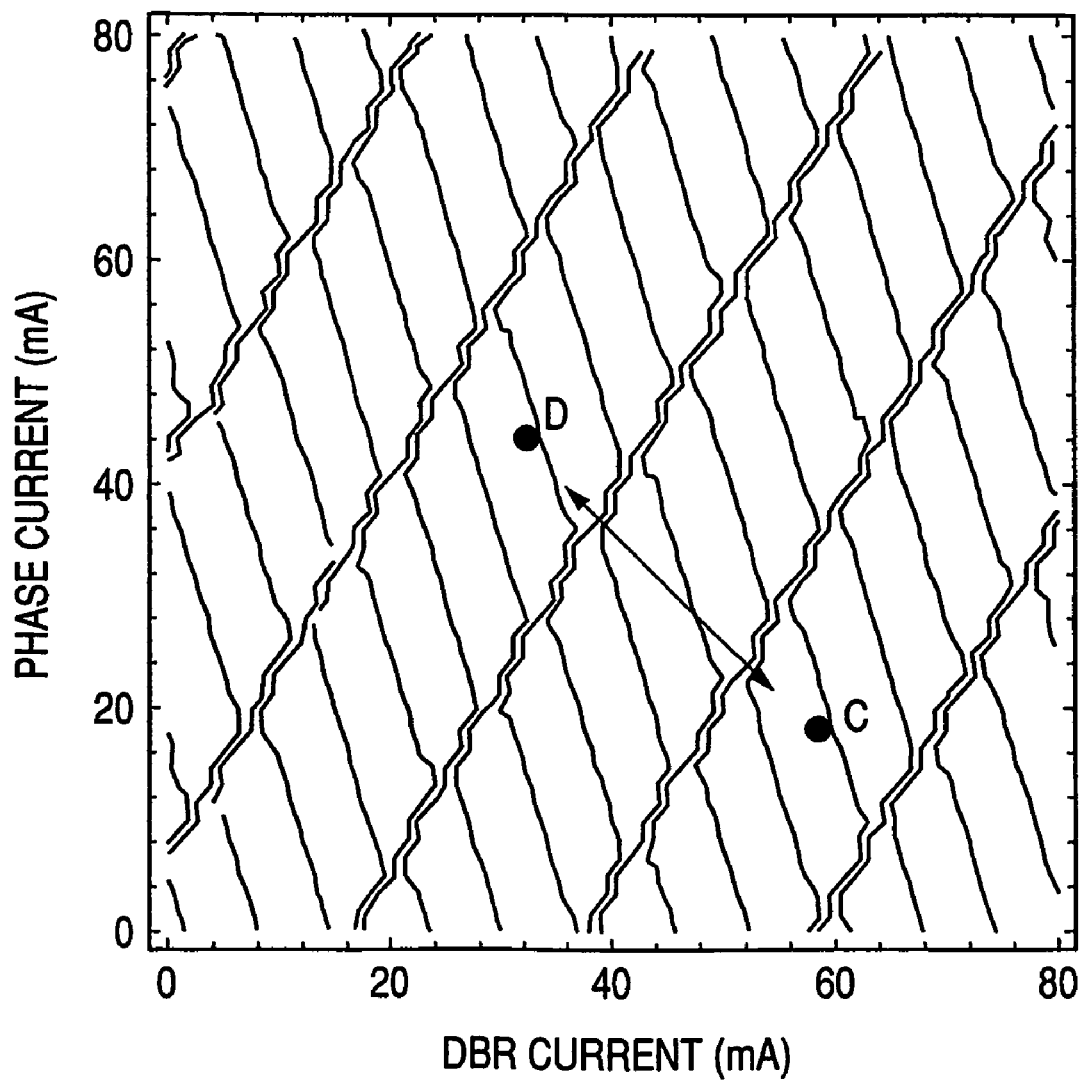
FIG. 5 is an explanatory graph showing a relationship among the current flowing through the DBR part, a current flowing through a phase part, and the oscillation wavelength of the fundamental wave.

FIG. 5 shows a relationship among a current flowing through the DBR part 5, a current flowing through the phase part 6, and the oscillation wavelength of the fundamental wave. A contour line indicates a wavelength. The wavelength becomes smaller as a point is shifted from the origin to upper right. In this embodiment, for modulation control, the adjustment is performed in advance such that a point C in the drawing which is the phase matching wavelength of the light wavelength conversion device 3 becomes an ON value and a point D in the drawing becomes an OFF value.

In this embodiment, the modulation control is performed using the current based on the PWM signal in which a sum of the current flowing through the DBR part 5 and the current flowing through the phase part 6 is maintained substantially constant. As a result, it is possible to maintain the amount of heat generated therein substantially constant. Therefore, an effect of improved thermal stability can be obtained as compared with the first embodiment.

A signal source may be separately provided for the DBR part and the phase part. A circuit is constructed such that a modulation current based on the PWM signal is supplied to the DBR part at the time of ON and the modulation current is supplied to the phase part at the time of OFF, whereby the control using a single signal source can also be performed. The sum of the current flowing through the DBR part 5 and the current flowing through the phase part 6 is not limited to a constant value and thus various configurations can be used.

In addition, even when only the phase part 6 is controlled for modulation using the current based on the PWM signal, the same effect can be obtained. In general, a rate of a change in wavelength to a current injected to the phase part 6 is smaller than that in the case of the DBR part 5. Therefore, a larger change in current is required to obtain a desirable change in wavelength. Thus, it is desirable to control at least the DBR part 5.

Third Embodiment

Next, a third embodiment of the present invention will be described with reference to the drawing.

Figure 6:
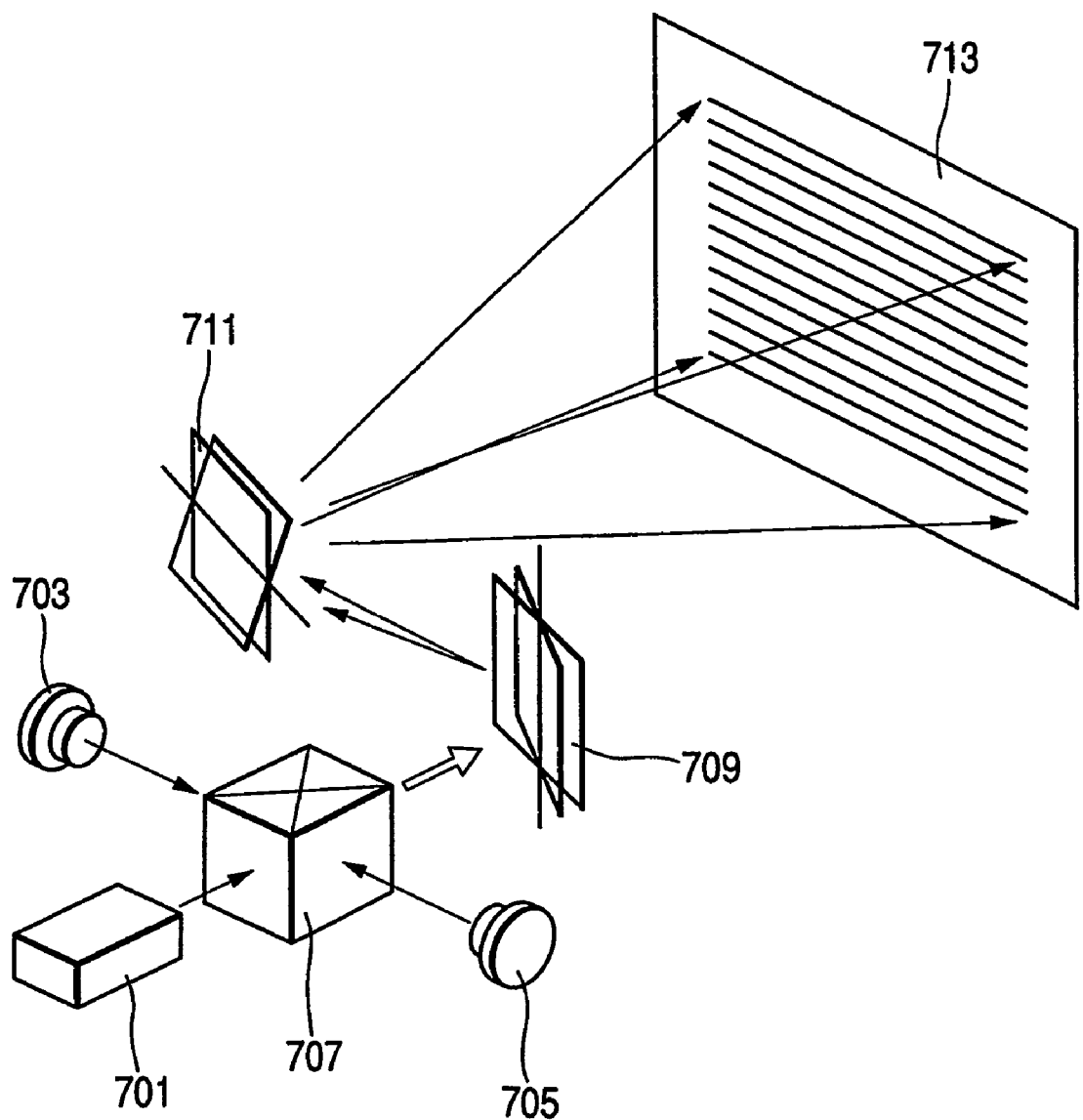
FIG. 6 is a schematic structural view showing an image display apparatus according to a third embodiment of the present invention.

FIG. 6 is a schematic structural view showing an image display apparatus according to a third embodiment of the present invention. In the drawing, reference numeral 701 denotes a green light source which is composed of a modulation light source and outputs green laser light as described in the first embodiment and the second embodiment, 703 denotes a red light source composed of a semiconductor laser module, 705 denotes a blue light source composed of a semiconductor laser module, 707 denotes a dichroic mirror, 709 denotes a horizontal scanning device, 711 denotes a vertical scanning device, and 713 denotes a projected surface.

Light beams outputted from the light sources 701, 703, and 705 are combined by the dichroic mirror 707. The combined light beam is scanned by the two scanning devices 709 and 711 to form a scanning line on the projected surface 713. When the light sources 701, 703, and 705 are modulated based on respective color image information of red, green, and blue, it is possible to display a predetermined image on the projected surface 713.

The modulation light source of the present invention has the same modulation performance as that of the semiconductor laser, so red, green, and blue light can be modulated in the same way. Therefore, it is possible to display an image capable of realizing high-resolution gradation level expression.

Fourth Embodiment

Figure 7:
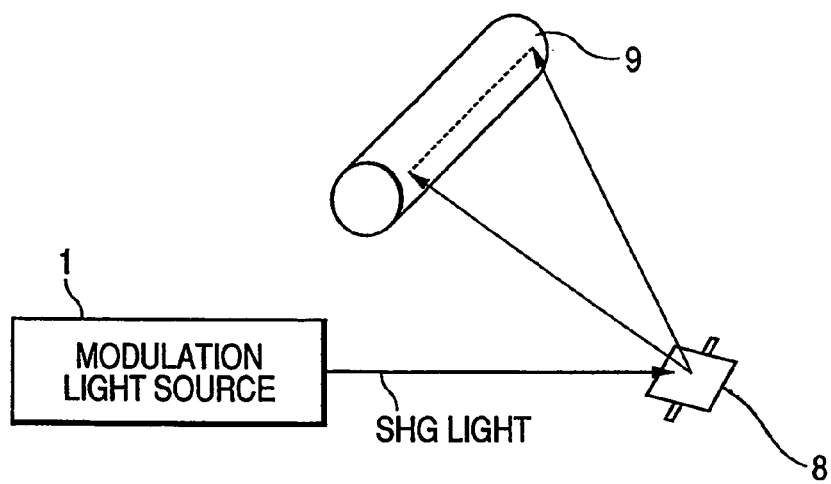
FIG. 7 is a schematic structural view showing an image display apparatus according to a fourth embodiment of the present invention.
Figure 8:
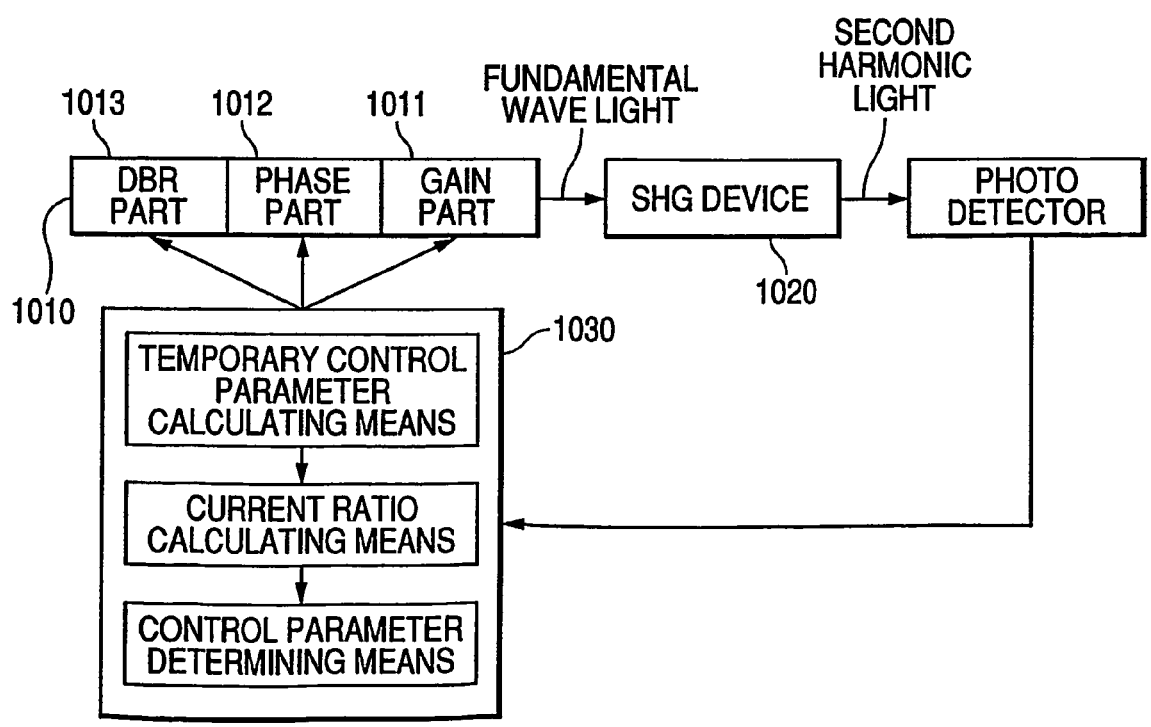
FIG. 8 is an explanatory diagram showing a background art.

Next, a fourth embodiment of the present invention will be described with reference to the drawing. FIG. 7 is a schematic structural view showing an image display apparatus according to a fourth embodiment of the present invention. In the drawing, reference numeral 1 denotes a modulation light source and outputs green laser light as described in the first embodiment and the second embodiment, 8 denotes a light deflector, and 9 denotes a photosensitive member. A wavelength of the modulation light source is suitably determined according to the wavelength sensitivity of the photosensitive member 9.

An SHG light emitted from the modulation light source 1 is one-dimensionally deflected by the light deflector 8, and forms an image on the photosensitive member 9. According to this embodiment, the modulation light source of the present invention is used for an electrophotographic process image forming apparatus, whereby it is possible to display an electrophotography capable of realizing high-resolution gradation level expression.

This application claims priority from Japanese Patent Application No. 2004-084439 filed on Mar. 23, 2004, which is hereby incorporated by reference herein.

The invention claimed is:

1. A modulation light source comprising:
   a DBR laser which outputs a fundamental light, and which includes a DBR part, a phase part and a gain part;
   a light wavelength conversion device characterized by a phase matching wavelength, wherein said wavelength conversion device is arranged to receive the fundamental light output by said DBR laser, and wherein said wavelength conversion device outputs a second harmonic light in response to receipt of light whose wavelength is substantially near the phase matching wavelength and outputs substantially no second harmonic light in response to receipt of light whose wavelength is deviated substantially from the phase matching wavelength; and
   a controller,
   wherein the controller provides a prescribed current to the gain part and the phase part, respectively and provides a current to the DBR part based on a PWM signal in which pulse width is modulated corresponding to an image signal, thereby modulating a wavelength of the fundamental light to deviate from the phase matching wavelength of said light wavelength conversion device.

2. A modulation light source for an image display comprising:
   a DBR laser which outputs a fundamental light, and which includes a DBR part, a phase part and a gain part;
   a light wavelength conversion device characterized by a phase matching wavelength, wherein said wavelength conversion device is arranged to receive the fundamental light output by said DBR laser, and wherein said wavelength conversion device outputs a second harmonic light in response to receipt of light whose wavelength is substantially near the phase matching wavelength and outputs substantially no second harmonic light in response to receipt of light whose wavelength is deviated substantially from the phase matching wavelength; and
   a controller,
   wherein the controller provides a prescribed current to the gain part and the phase part, respectively and provides a current to the DBR part based on a PWM signal in which pulse width is modulated corresponding to an image signal, thereby modulating a wavelength of the fundamental light to deviate from the phase matching wavelength of said light wavelength conversion device, whereby the light wavelength conversion device outputs a second harmonic light corresponding to the image signal.

3. An image display apparatus comprising:
the modulation light source according to claim 1; and
a light deflector.

4. An electrophotographic process image display apparatus comprising:
the modulation light source according to claim 1;
a light deflector; and
a photosensitive member.

5. A method of driving a modulation light sources, wherein said modulation light source comprises a DBR laser which outputs a fundamental light and which includes a DBR part, a phase part and a gain part, and further comprises a light wavelength conversion device, characterized by a phase matching wavelength, wherein said wavelength conversion device is arranged to receive the fundamental light output by said DBR laser, and wherein said wavelength conversion device outputs a second harmonic light in response to receipt of light whose wavelength is substantially near the phase matching wavelength and outputs substantially no second harmonic light in response to receipt of light whose wavelength is deviated substantially from the phase matching wavelength;
wherein said method comprises the steps of:
providing a prescribed current to the gain part and the phase part, respectively; and
providing a current to the DBR part based on a PWM signal in which pulse width is modulated corresponding to an image signal, thereby modulating a wavelength of the fundamental light to deviate from the phase matching wavelength of said light wavelength conversion device.

6. A modulating light source, comprising:
a DBR laser which outputs a fundamental light, and which includes a DBR part, a phase part and a gain part;
a light wavelength conversion device characterized by a phase matching wavelength, wherein said wavelength conversion device is arranged to receive the fundamental light output by said DBR laser, and wherein said wavelength conversion device outputs a second harmonic light in response to receipt of light whose wavelength is substantially near the phase matching wavelength and outputs substantially no second harmonic light in response to receipt of light whose wavelength is deviated substantially from the phase matching wavelength; and
a controller,
wherein the controller controls a current provided to at least one of the DBR part and the phase part based on a PWM signal, thereby modulating a wavelength of the fundamental light such that the wavelength of the fundamental light is deviated from the phase matching wavelength of said light wavelength conversion device, whereby the second harmonic light is modulated.

7. The modulated light source according to claim 6, wherein the controller controls a current provided to the DBR part based on the PWM signal, and provides a prescribed current to the gain part and the phase part, respectively.

8. The modulation light source according to claim 1, wherein the prescribed current to the phase part is a current that is constant for a time period longer than that corresponding to a maximal pulse width of the PWM signal.

9. The modulation light source according to claim 2, wherein the prescribed current to the phase part is a current that is constant for a time period longer than that corresponding to a maximal pulse width of the PWM signal.

10. The method according to claim 5, wherein the prescribed current to the phase part is a current that is constant for a time period longer than that corresponding to a maximal pulse width of the PWM signal.

11. The modulation light source according to claim 7, wherein the prescribed current to the phase part is a current that is constant for a time period longer than that corresponding to a maximal pulse width of the PWM signal.

* * * * *